United States Patent [19]

Mochizuki et al.

[11] 4,351,677

[45] Sep. 28, 1982

[54] METHOD OF MANUFACTURING SEMICONDUCTOR DEVICE HAVING ALUMINUM DIFFUSED SEMICONDUCTOR SUBSTRATE

[75] Inventors: Yasuhiro Mochizuki; Yoko Wakui; Hiroaki Hachino, all of Hitachi, Japan

[73] Assignee: Hitachi, Ltd., Tokyo, Japan

[21] Appl. No.: 167,399

[22] Filed: Jul. 10, 1980

[30] Foreign Application Priority Data

Jul. 16, 1979 [JP] Japan ................................ 54-89339

[51] Int. Cl.³ .......................................... H01L 21/225
[52] U.S. Cl. ................................ 148/188; 148/187; 148/190
[58] Field of Search ................... 29/589, 571; 148/182, 148/188, 190

[56] References Cited

U.S. PATENT DOCUMENTS

| | | | |
|---|---|---|---|
| 4,040,878 | 8/1977 | Rowe | 148/188 |
| 4,050,967 | 9/1977 | Rosnowski et al. | 148/188 X |
| 4,066,485 | 1/1978 | Rosnowski et al. | 148/188 |
| 4,099,997 | 7/1978 | Rosnowski | 148/187 |
| 4,154,632 | 5/1979 | Mochizuki et al. | 148/188 X |
| 4,188,245 | 2/1980 | Chang et al. | 148/188 |

*Primary Examiner*—G. Ozaki
*Attorney, Agent, or Firm*—Antonelli, Terry & Wands

[57] ABSTRACT

A method of manufacturing a semiconductor device of the type wherein aluminum layers are selectively deposited on a major surface of a silicon semiconductor substrate and thereafter aluminum is selectively diffused into the silicon semiconductor substrate by means of heat treatment. $SiO_2$ mask is selectively formed on at least one major surface of the silicon semiconductor substrate, then aluminum is deposited onto the major surface being close to but separated from the $SiO_2$ mask, subsequently the silicon semiconductor substrate is subjected to a heat treatment to selectively diffuse the aluminum into the silicon semiconductor substrate.

The $SiO_2$ mask which is formed before the heat treatment prevents impurity atoms from autodoping through the $SiO_2$ mask. No cracking occurs in the $SiO_2$ mask because the aluminum diffusion source is apart from the periphery of the $SiO_2$ mask.

6 Claims, 14 Drawing Figures

METHOD OF MANUFACTURING SEMICONDUCTOR DEVICE HAVING ALUMINUM DIFFUSED SEMICONDUCTOR SUBSTRATE

BACKGROUND OF THE INVENTION

This invention relates to a method of fabricating a semiconductor device having an aluminum isolation region and more particularly to a method of selective formation of an aluminum-diffused region within a silicon semiconductor substrate.

Aluminium is a P-type dopant having a large diffusion coefficient in silicon and is therefore highly effective for forming a deeply-diffused region such as for example a through-diffused region for isolation purposes. A method has hitherto been known in which aluminum diffusion source layers in the form of a predetermined pattern are formed on the major surface of a silicon semiconductor substrate by means of deposition or the like, and the silicon semiconductor substrate is then heated in an atmosphere including an oxygen gas to form silicon-aluminum alloy layers from which aluminum diffuses into the silicon semiconductor substrate to deeply and selectively form aluminum diffused layers.

The method as mentioned above is described in, for example, U.S. Pat. No. 4,040,878 issued to Rowe on Aug. 9, 1977 and U.S. Pat. No. 4,066,485 issued to Rosnowski et al. on Jan. 3, 1978.

In the conventional method, the oxygen gas contained in the diffusing atmosphere reacts with exposed portions of a silicon substrate to form an $SiO_2$ film and with aluminum deposited on the substrate to form $Al_2O_3$ films. If the thus formed $SiO_2$ film has a sufficient thickness, it may prevent out-diffused impurity atoms from autodoping, in other words, backdoping into the substrate through the $SiO_2$ film. The $Al_2O_3$ films on the aluminum prevent aluminum from evaporation.

In carrying out the process of the prior art, the accurate controlling of oxidizing conditions including a flow rate of the oxygen gas is important to obtain an accurate diffusion front and to obtain high reproducibility of semiconductor devices. Further, it is difficult in the prior art to obtain such a thick $SiO_2$ film that completely prevents the autodoping avoiding introduction of cracks in the $SiO_2$ film, because a thick $SiO_2$ film, which is formed during the aluminum diffusion in an oxygen containing atmosphere is easily crystallized. The crystallized $SiO_2$ is never acceptable to the semiconductor devices.

SUMMARY OF THE INVENTION

An object of the present invention is to provide a method of fabricating a semiconductor device by utilizing selective diffusion of aluminum which may obviate the aforementioned disadvantages.

Another object of the present invention is to provide a method of fabricating a semiconductor device by utilizing selective diffusion of aluminum with high reproducibility and reliability.

Still another object of the present invention is to provide a method of selective diffusion of aluminum with a non-crystallized mask which prevents impurity atoms from autodoping.

The method of fabricating a semiconductor device according to the invention comprises the steps of forming an $SiO_2$ mask onto a selected surface of a silicon substrate, then depositing aluminum onto the exposed area on the same surface of the silicon substrate which is apart from the $SiO_2$ mask, and thereafter heating the silicon semiconductor substrate to selectively diffuse the aluminum thereinto.

The above and other objects of the present invention will be apparent from the following description taken in conjunction with the accompanying drawings and the appended claims.

DETAILED DESCRIPTION OF PREFERRED EMBODIMENTS

EXAMPLE 1

In this embodiment, a uni-surface type thyristor was manufactured.

Figure 1A:
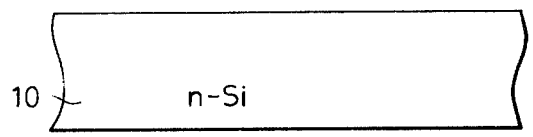
FIGS. 1a to 1g show steps of a manufacturing method of the invention.

In FIG. 1a, there is shown a silicon semiconductor substrate 10. The silicon semiconductor substrate 10 is prepared through FZ (Floating Zone) method with its surfaces polished to mirror surface, and has an N-conductivity type, a resistivity of 90 to 110 $\Omega$-cm, a dislocation-free property, a crystal axis of $<111>$, a diameter of 76 mm, and a thickness of 500 $\mu$m.

Figure 1B:
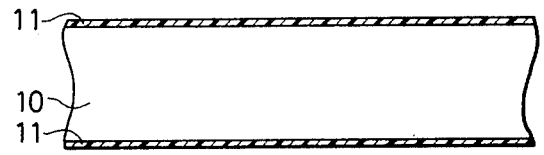

As shown in FIG. 1b, on the opposite major surfaces of the silicon semiconductor substrate 10 were formed $SiO_2$ films 11 employing a method of thermal oxidization of the silicon substrate at a temperature of 1100° C. in a steam atmosphere. The thickness of each of the $SiO_2$ films 11 was 1.0 $\mu$m.

Figure 1C:
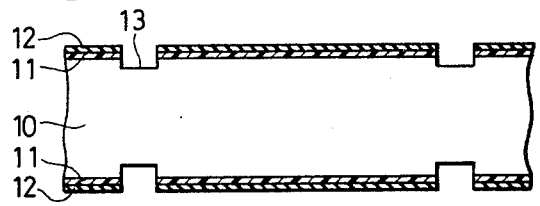

As shown in FIG. 1c, on the exposed major surfaces of the $SiO_2$ films 11 formed were photoresist layers 12 in the form of a predetermined pattern on the area other than the part to be formed with recesses 13 in the opposite major surfaces of the silicon semiconductor substrate 10. The recesses 13 having a depth of 6±1 $\mu$m were formed by etching off the exposed portions of the $SiO_2$ films 11 with a mixed solution of hydrofluoric acid and ammonium fluoride, and the silicon substrate 10 with a mixed solution of hydrofluoric acid (40 ml), nitric acid (130 ml), acetic acid (80 ml) and iodine (0.2 g). The recesses 13 were arranged to be patterned into an orthogonal grating, each having a width of 116 $\mu$m and being mutually spaced by a distance of 6.6 mm.

Figure 1D:
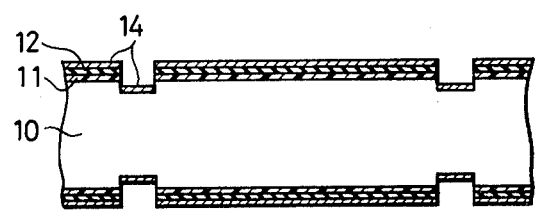

The silicon semiconductor substrate was then coated with aluminum deposited layers 14 as shown in FIG. 1d. Aluminum was deposited in vacuum from a evaporation source of an aluminum wire having a purity of 99.9995% onto the substrate maintained at a temperature of 120° to 140° C. under a pressure of $3 \times 10^{-6}$ Torr by electron-beam heating to form the aluminum deposited layer having a thickness of 3 $\mu$m.

Figure 1E:
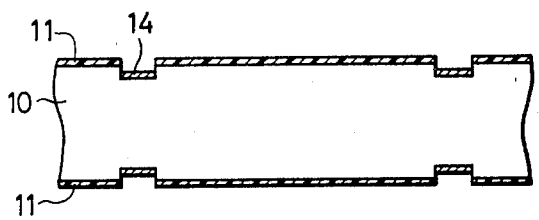

The aluminum deposited layers 14 formed on the photoresist layers 12 were removed by thermal decomposition of the photoresist layers 12 at a temperature of 410° C. in an $N_2$ flow as shown in FIG. 1e. Thus, the aluminum deposited layers 14 remained in the recesses 13 formed in the major surfaces of the silicon semiconductor substrate 10.

Figure 1F:
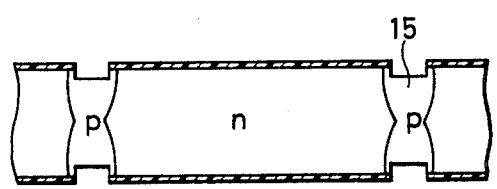

Thereafter, the silicon semiconductor substrate 10 was heated to cause the aluminum to be selectively diffused throughout the thickness of the substrate as shown in FIG. 1f. The diffusion process was carried out at a temperature of 1250° C. for 96 hours in a mixed gas flow of 2 l/min. nitrogen and 20 ml/min. oxygen. The maximum concentration of aluminum was $2 \times 10^{18}$ atoms/cm$^3$. The mixed gas flow employed above contained about 1% by volume of oxygen, which was low enough to prevent the crystallization of an SiO$_2$ film formed in the recess during the diffusion process.

Figure 1G:
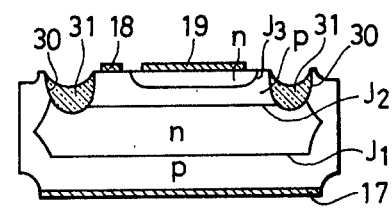

FIG. 1g shows, in section, a uni-surface type thyristor which was prepared through a process wherein dopants of P-type and N-type are first diffused into the silicon semiconductor substrate 10 as shown in FIG. 1f by applying the usual semiconductor device fabricating technique to form P-N junctions J$_1$ to J$_3$. Moats 30 covered with glass 31, anode, gate and cathode electrodes 17, 18 and 19 were then formed, and finally the substrate was subjected to dicing at the central portion of the isolation diffused layer 15 to obtain separated pellets. This thyristor had neither cracks in the SiO$_2$ film nor dislocations in the silicon semiconductor substrate. The above described process showed a high reproducibility of the thyristors.

Comparison 1

A silicon semiconductor substrate usable for a uni-surface type thyristor was prepared by the following steps of: forming SiO$_2$ films 11 by thermal oxidation; forming the photoresist layers 12 in the form of a predetermined pattern; etching off the exposed portion of the SiO$_2$ films 11; depositing an aluminum layer 14 onto the photoresist layer 12 and the exposed portions of the silicon semiconductor substrate 10; and removing the aluminum layer 14 on the photoresist layer 12 employing the lift-off method, whereby the SiO$_2$ films and aluminum layer are in touch with each other.

Subsequently, the silicon semiconductor substrate was heated to cause the aluminium to be selectively diffused throughout the thickness of the substrate to form the isolation diffused layer 15.

In this case, cracking occurred in the SiO$_2$ films at the portions in touch with the aluminum layer. This was because crystallization of the SiO$_2$ to an α-cristobalite occurred by diffusion of aluminum into the SiO$_2$ films. At the same time, the α-cristobalite structure brought about a stress to the silicon semiconductor substrate, which deteriorated the characteristics of the semiconductor devices.

EXAMPLE 2

In this embodiment, a planar type thyristor having a high voltage characteristic was manufactured.

Figure 2A:
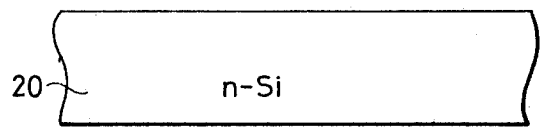
FIGS. 2a to 2g show steps of another manufacturing method of the invention.

In FIG. 2a, a silicon semiconductor substrate 20 is shown. The silicon semiconductor substrate 20 was prepared through FZ (Floating Zone) method with its surfaces polished to a mirror surface, and had an N-conductivity type, a resistivity of 25 to 35 Ω-cm, a dislocation-free property, a crystal axis of <111>, a diameter of 76 mm, and a thickness of 175 μm.

Figure 2B:
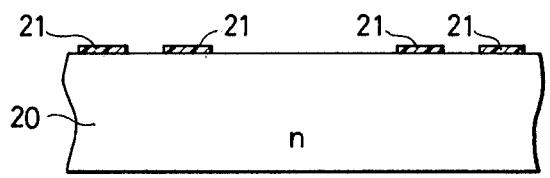

As shown in FIG. 2b, SiO$_2$ films 21 were formed on one of a pair of major surfaces of the silicon semiconductor substrate employing thermal oxidization of the silicon at a temperature of 1100° C. for 2 hours in steam to form an SiO$_2$ film of a thickness of 1.0 μm. Then the SiO$_2$ films 21 were selectively removed using a photoetching technique to obtain the masking patterns for selective diffusion of P-type base regions and the isolation regions.

Figure 2C:
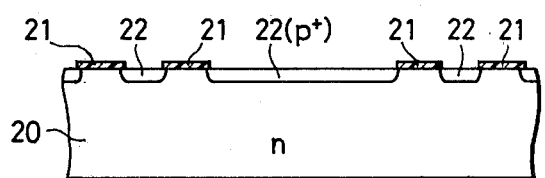

P-type boron diffused layers 22, that is, P-type base regions, an isolation region, and a P-type emitter layer were formed by boron diffusion at a temperature of 1020° C. for 2 hours using a BN plate as a doping source, as shown in FIG. 2c. P-type base regions had each 0.8 mm square and the isolation region was arranged to be patterned into an orthogonal grating, having each a width of 200 μm and being mutually spaced by a distance of 1.46 mm.

Figure 2D:
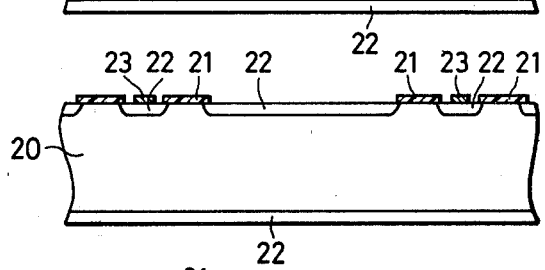

An aluminum layer of 2 μm thickness was deposited onto the SiO$_2$ films 21 and the exposed portions of the major surface of the silicon semiconductor substrate by the similar process employed in Example 1 of the present invention. Then the aluminum layer 23 was selectively removed using a photoetching technique leaving a pattern of an orthogonal grating, having each a width of 116 μm, on the exposed surface of the boron diffused isolation region, as shown in FIG. 2d. Namely, the aluminum layer 23 was apart from the SiO$_2$ films by a distance of about 2 μm.

Figure 2E:
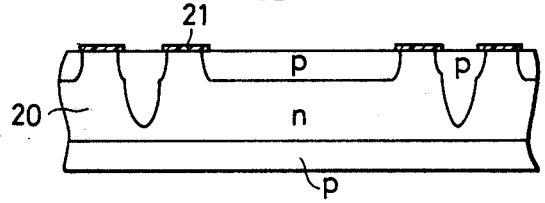

Thereafter, the silicon semiconductor substrate 20 was heated for causing the aluminum to be selectively diffused into the substrate as shown in FIG. 2e. Simultaneously, the boron diffused layers 22 were subjected to driving-in to a predetermined size. This driving-in was performed at a temperature of 1250° C. for 35 hours in a mixed gas flow of 2 l/min. nitrogen and 20 ml/min. oxygen.

Figure 2F:
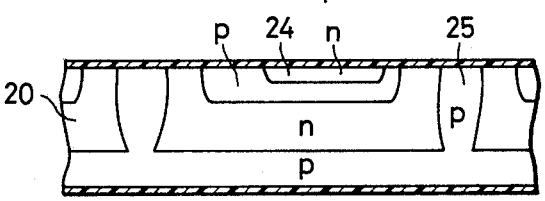

As shown in FIG. 2f, N-type emitter regions 24 were formed using a process of making mask patterns by oxidization of the silicon substrate and photoetching technique, and by diffusing phosphorus into the substrate through openings of the mask patterns. The first was predeposition of phosphorus from POCl$_3$ at a temperature of 1020° C. for 1 (one) hour, and the second was the driving-in diffusion at a temperature of 1250° C. for 6 hours in an oxygen flow. The second heating drove the aluminium diffused region to reach the boron diffused P-type emitter as shown in the Figure.

Figure 2G:
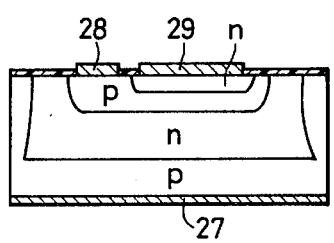

FIG. 2g shows, in section, a planar type thyristor which was obtained from the silicon semiconductor substrate shown in FIG. 2f by applying a conventional technique to form anode, gate and cathode electrodes 27, 28 and 29. Finally, the substrate was subjected to dicing at the intermediate portion of the isolation diffused layer 25 to obtain separated pellets. This planar type thyristor ensures a blocking voltage of more than 600 V.

Comparison 2

A planar type thyristor similar to that shown in FIG. 2g was produced. In this case, the isolation diffused layer 25 was formed by the following steps of: removing the SiO$_2$ films 21 after performing the step shown in FIG. 2c; depositing an aluminum layer onto the major surface from which the SiO$_2$ films had been removed; removing selectively the aluminum layer so as to leave an aluminum pattern similar to the pattern of the aluminum layer 23 shown in FIG. 2d; and heating the substrate to cause the aluminum to be selectively diffused into the substrate in an atmosphere containing an oxygen gas, while forming a thin SiO$_2$ film which covers the exposed surface of the Si substrate.

In this case, however, out-diffusion of boron from the P-type boron diffused layer and autodoping of boron into the N-type portions of the substrate occurred. As a result, a planar P-N junction between P-type base region and N-type base region as shown in FIG. 2g could not be formed. This fact means that the thin SiO$_2$ film formed during the aluminum diffusion was not sufficient for preventing the autodoping. When a thick SiO$_2$ film is formed during the aluminum diffusion, which has a enough thickness to prevent the autodoping, the thick SiO$_2$ film easily crystallizes to α-cristobalite.

The invention was described by way of the embodiments as applied to the isolation diffusion but it is obviously applicable to formation of other types of diffused layer.

In place of the diffusion source of aluminum deposited layer, a diffusion source of aluminum-silicon alloy may be used.

In the example 2, the aluminum layer 23 may be deposited onto both of the major surfaces. In other words, the process described by way of Example 1, may be applied to the process of Example 2, whereby a necessary time for obtaining a through-diffused isolation region is drastically reduced.

We claim:

1. A method of selectively diffusing aluminum into a silicon semiconductor substrate comprising the steps of:
    (a) selectively forming a layer of silicon dioxide to provide a mask pattern having at least one opening therein over a major surface of a silicon semiconductor substrate having an N-conductivity type,
    (b) depositing aluminum onto said major surface of said silicon semiconductor substrate so that said aluminum is spaced apart from said layer of silicon dioxide, and
    (c) subjecting said substrate to a heat treatment for selectively diffusing said aluminum into selected regions of said silicon semiconductor substrate; said aluminum being spaced from said layer of silicon dioxide sufficiently to avoid diffusion of the aluminum into said silicon dioxide layer.

2. A method as claimed in claim 1, wherein said aluminum is deposited into a recess formed in said major surface of said silicon semiconductor substrate.

3. A method as claimed in claim 1, wherein said step of selectively diffusing the aluminum is carried out with a flow of a mixed gas which contains an oxygen gas in an amount to form a non-crystallized silicon dioxide film by oxidizing said silicon semiconductor substrate at a portion adjacent to said aluminum.

4. A method of selectively diffusing aluminum into a silicon semiconductor substrate comprising the steps of:
    (a) selectively forming a layer of silicon dioxide to provide a mask pattern having at least one opening therein over a major surface of a silicon semiconductor substrate,
    (b) selectively doping impurity atoms which modify a conductivity type of said silicon semiconductor substrate from a portion free of said layer of silicon dioxide on said major surface into the substrate,
    (c) depositing aluminum onto said major surface of said silicon semiconductor substrate so that said aluminium is spaced apart from a periphery of said layer of silicon dioxide, and
    (d) subjecting said substrate to a heat treatment for selectively diffusing said aluminum into said silicon semiconductor substrate; said aluminum being spaced sufficiently from the periphery of said silicon dioxide that aluminum is prevented from diffusing into said layer of silicon dioxide during said heat treatment.

5. A method as claimed in claim 4, which further comprises: after said heat treatment, doping said impurity atoms into an opposite major surface of said substrate so as to form a layer of P-conductivity type, whereby the region formed by selectively diffusing aluminum is contiguous to said layer of P-conductivity type.

6. A method as claimed in claim 1 or claim 4, wherein said aluminum is spaced apart from said layer of silicon dioxide by distance of about 2 μm.

* * * * *